United States Patent
Lee et al.

(10) Patent No.: US 7,872,250 B2
(45) Date of Patent: Jan. 18, 2011

(54) PHASE-CHANGE RAM AND METHOD FOR FABRICATING THE SAME

(75) Inventors: Sang-mock Lee, Yongin-si (KR); Jin-heong Yim, Suwon-si (KR); Yoon-ho Khang, Yongin-si (KR); Jin-seo Noh, Seoul (KR); Dong-seok Suh, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/428,284

(22) Filed: Apr. 22, 2009

(65) Prior Publication Data
US 2009/0236582 A1    Sep. 24, 2009

Related U.S. Application Data

(63) Continuation of application No. 11/285,175, filed on Nov. 23, 2005, now Pat. No. 7,541,633.

(30) Foreign Application Priority Data
Feb. 25, 2005    (KR) .................. 10-2005-0016183

(51) Int. Cl.
*H01L 47/00*    (2006.01)
(52) U.S. Cl. ................ 257/2; 257/298; 257/311; 257/E27.084; 257/E27.086

(58) Field of Classification Search ............... 257/296, 257/298, 306, 311, E27.084, E27.086, E29.343, 257/1–5
See application file for complete search history.

(56) References Cited

U.S. PATENT DOCUMENTS

| 7,214,958 | B2 | 5/2007 | Happ |
| 7,323,708 | B2 | 1/2008 | Lee et al. |
| 7,414,257 | B2 * | 8/2008 | Happ et al. .......... 257/2 |
| 2005/0019975 | A1 | 1/2005 | Lee et al. |

FOREIGN PATENT DOCUMENTS
CN    1536688 A    10/2004

OTHER PUBLICATIONS

Office Action from corresponding Chinese Application No. 200510126836.7 mailed Aug. 22, 2008.

* cited by examiner

*Primary Examiner*—Matthew E Warren
(74) *Attorney, Agent, or Firm*—Buchanan Ingersoll & Rooney PC

(57) ABSTRACT

A PRAM and a fabricating method thereof are provided. The PRAM includes a transistor and a data storage capability. The data storage capability is connected to the transistor. The data storage includes a top electrode, a bottom electrode, and a porous PCM layer. The porous PCM layer is interposed between the top electrode and the bottom electrode.

17 Claims, 10 Drawing Sheets

PHASE-CHANGE RAM AND METHOD FOR FABRICATING THE SAME

CROSS-REFERENCE TO RELATED PATENT APPLICATION

This application claims the benefit of Korean Patent Application No. 10-2005-0016183, filed on Feb. 25, 2005, in the Korean Intellectual Property Office, the disclosure of which is incorporated herein in its entirety by reference.

BACKGROUND OF THE DISCLOSURE

1. Field of the Disclosure

The present disclosure relates to a non-volatile memory, and more particularly, to a phase-change random access memory (PRAM) having a structure capable of reducing a reset current and a method for fabricating the same.

2. Description of the Related Art

The PRAM is an element memorizing binary information using characteristics so that a phase-change material such as GeSbTe is changed in its phase into crystalline and amorphous by local heat generation due to an electrical pulse. In the PRAM, a memory cell memorizing the binary information includes a phase-change layer, a resistor, and a switch transistor. The transistor is manufactured on a silicon wafer and the resistor and the phase-change layer are formed on the transistor. The phase-change layer is a so-called GST(GeSbTe)-based material. The phase-change material is a material used for a magnetic recorder that uses media such as a digital video disk (DVD) and a compact disk (CD)-rewritable (RW) and is called chalcogenide. The resistor is intended to heat the phase-change layer. As the phase-change layer is heated, the phase-change layer is changed in its phase into crystalline and amorphous so that the resistance is varied and a voltage is varied due to a current flowing on a resistor, whereby the binary information can be stored and read.

A dynamic random access memory (DRAM), a static random access memory (SRAM), which is a volatile memory, or a flash memory, which is a non-volatile memory store the binary information in form of a "charge" (charge-base memory). On the contrary, the PRAM stores the binary information in form of a "resistance" (resistance-base memory). Accordingly, the PRAM can be differentiated from other memory elements.

For the thin film material used for the PRAM, an alloy of GeSbTe series material is primarily used. This material has a characteristic so that a negative differential resistance property appears when a voltage between 0.6-0.9 volt (V) is applied so that its resistivity is drastically reduced.

Since the above-described PRAM has a large on/off ratio which is one of references discriminating the functionality of a memory device storing the binary information, compared with other memory elements, not only the binary information can be easily discriminated in a circuit but also a circuit maintaining a high voltage is not required. Since the ratio has a scale of more than forty times other memory elements when represented in terms of resistivity, a wide dynamic range can be secured. Therefore, the PRAM has an advantage in its scalability even if small-sizing and integration trends for semiconductor integrated circuit technology are sought. The scalability is advantageous in the commercialization of the PRAM in the future and its distinctive character is apparent when compared with the flash memory. Since a high voltage greater than a power source voltage is required for writing and deleting operations in the flash memory, the circuit design is complicated. On the contrary, since all electrical operations can be performed within an applied power source voltage in the PRAM, power consumption is small.

For commercialization of the PRAM, a variety of research approaches for reducing the reset current of the PRAM are being investigated. For example, the reset current of the PRAM can be reduced by reducing an area size of a bottom electrode contact (BEC) to increase current density. However, there are limitations in the structure of the PRAM by reducing the area of the contact portion. Therefore, the development of other ways to reduce the reset current of the PRAM is required.

SUMMARY OF THE DISCLOSURE

The present invention may provide a PRAM having a structure capable of reducing a reset current and a method for fabricating the same.

According to an aspect of the present invention, there may be provided a PRAM, which includes: a transistor; and data storage connected to the transistor, the data storage including a top electrode, a bottom electrode, and a porous phase-change material (PCM) layer interposed between the top electrode and the bottom electrode.

According to another aspect of the present invention, there may be provided a method for fabricating a PRAM, including: forming a transistor on a substrate; and forming a data storage connected to the transistor, the forming of the data storage including: forming a bottom electrode; forming a porous PCM layer having a nano air-pores on the bottom electrode; and forming a top electrode on the porous PCM layer.

According to the present invention, there may be provided a PRAM having a structure such that a current density of the PCM layer is increased and the reset current is reduced.

BRIEF DESCRIPTION OF THE DRAWINGS

The above and other features and advantages of the present invention will be apparent by describing in detail exemplary embodiments thereof with reference to the attached drawings in which.

DETAILED DESCRIPTION OF EXEMPLARY EMBODIMENTS

Figure 1:
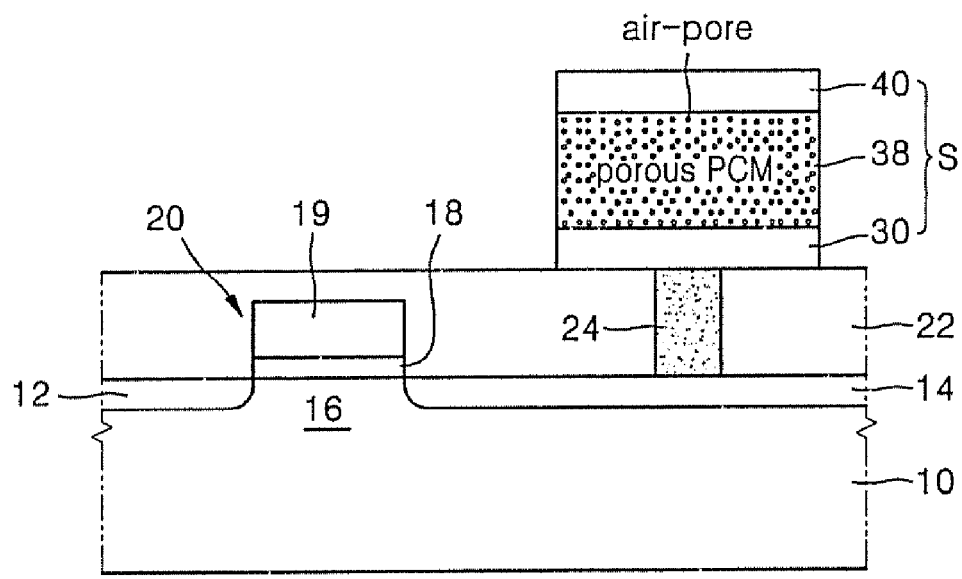
FIG. 1 is a schematic, cross-sectional view of a PRAM according to a preferred embodiment of the present invention.

The present invention will now be described more fully with reference to the accompanying drawings, in which exemplary embodiments of the invention are shown. In the drawings, the thicknesses of layers and regions are exaggerated for clarity.

FIG. 1 is a schematic, cross-sectional view of a PRAM according to a preferred embodiment of the present invention;

Referring to FIG. 1, the PRAM of the present invention includes a transistor 20 and a data storage S connected to the transistor 20.

The transistor 20 prepared on a substrate 10 includes a source 12 and a drain 14 doped with conductive impurities, a channel region 16 between the source 12 and the drain 14, and gate-stack materials 18 and 19 formed on the channel region 16. The gate-stack materials 18 and 19 include a gate insulation film 18 and a gate electrode 19 sequentially stacked. An insulation layer 22 is stacked on the transistor 20 and a contact hole prepared in the insulation layer 22 is filled with a conductive plug 24 so that the conductive plug 24 connects the transistor 20 with the data storage S.

The data storage S includes a top electrode 40, a bottom electrode 30, and a porous PCM layer 38 interposed between the top electrode 40 and the bottom electrode 30. Particularly, the porous PCM layer 38 includes nano air-pores. Here, the nano air-pore denotes an air-pore of a nano scale and a diameter of the air-pore is in a range of 1-10 nm. The nano air-pores can increase a current density of the PCM layer 38. In detail, since a current path such that a current flows through only the PCM by detouring the air-pores within the PCM layer 38 is formed, a current density of the PCM layer 38 can be increased. The increase in the current density can be explained in another manner. That is, since the PCM layer 38 is formed using an amount of the PCM reduced as much as a volume of the air-pores, the PCM layer 38 includes a relatively smaller amount of PCM than a PCM layer that does not contain the air-pores and thus the phase-change can occur at a current smaller than a current required for the phase-change of the PCM layer that dose not contain the air-pores. The above-described porous PCM layer 38 can be formed using a porogen material. A description thereof will be provided in detail in the following section concerning a method for fabricating the PRAM.

Here, the PCM is a chalcogenide material, e.g., a material of the GeSeTe (GST) series. Since the PCM used in the PRAM is already well known in the art, a detailed description thereof will be omitted. For example, for the PCM used in the PRAM, there are GeSbTe, AgSbTe, AgInTe, As(In)SbTe, GeTe, SeSbTe, AsSeTe, or Pb(Bi)Ge(In)Se as being representative.

According to the above-described present invention, the PRAM having a structure capable of reducing the reset current can become a reality.

Figure 2:
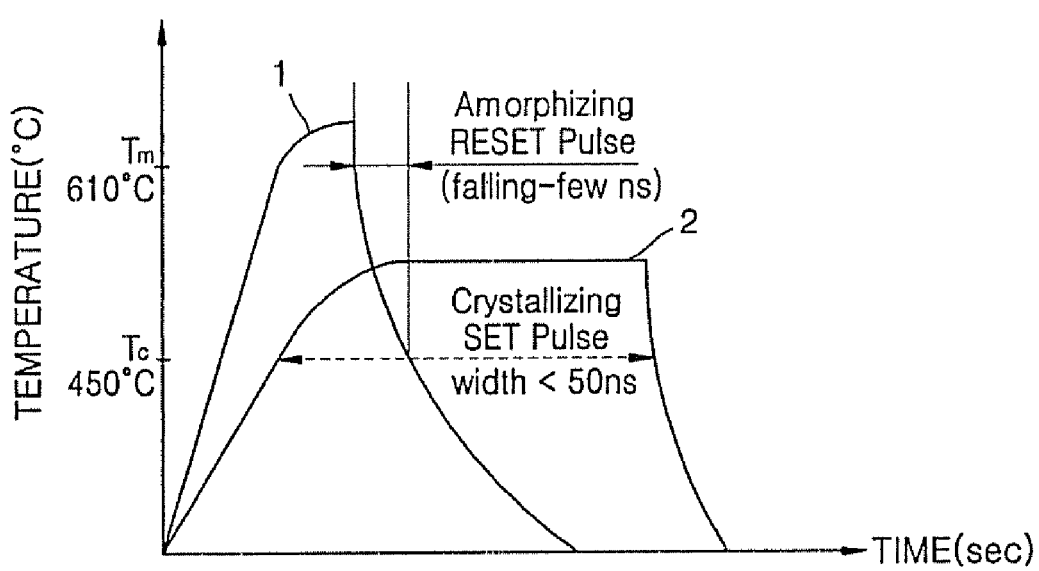
FIG. 2 is a graph illustrating an operation of storing binary information by a PRAM of the present invention.

FIG. 2 is a graph illustrating an operation of storing binary information by a PRAM of the present invention. A method of storing and deleting data in a memory cell of the PRAM can be described with reference to the graph. Here, a horizontal axis represents a time T and a vertical axis represents a temperature (unit ° C.) applied to a PCM film.

When the binary information is stored, a set pulse and a reset pulse are applied to the PRAM. The set pulse is intended for changing the PCM, e.g., the chalcogenide thin film into a crystalline phase and is a pulse having a width of less than about 50 ns. The set pulse is intended to apply more than a proper temperature required for the material to be crystallized. The reset pulse is a pulse for changing the thin film into an amorphous phase and for applying more than a temperature for melting the material into the amorphous phase.

Referring to FIG. 2, if the PCM layer is heated for a short period of time $T_1$ at a temperature higher than a melting temperature $T_m$ and then rapidly is quenched, the PCM layer being changed into the amorphous phase (first curve). On the contrary, if the PCM layer is annealed for a time $T_2$ longer than the time $T_1$ at a temperature lower than the melting temperature $T_m$ and higher than a crystallization temperature $T_c$ and then is quenched slowly, the PCM layer is changed into a crystalline phase (second curve). A specific resistance of the PCM layer in the amorphous phase is larger than that of the PCM layer in the crystalline phase. Therefore, it is possible to discriminate whether the information stored in the memory cell of the PRAM is a logic "1" or a logic "0" by detecting a current flowing through the PCM layer in a read-mode.

FIGS. 3A through 3G are diagrams illustrating respective processes in a method for fabricating a PRAM according to a preferred embodiment of the present invention.

Figure 3A:
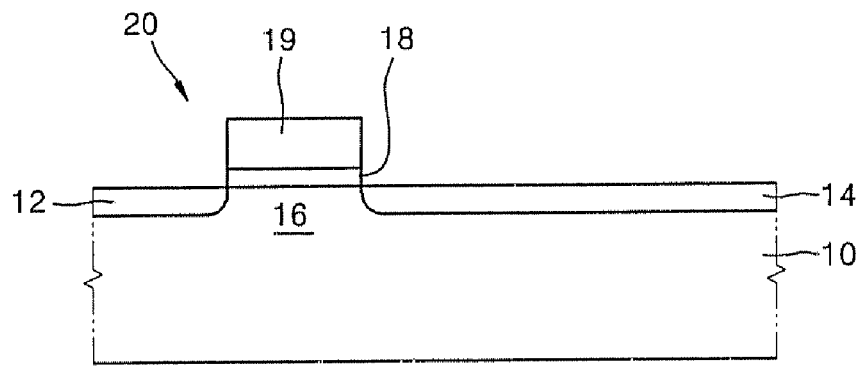
FIGS. 3A through 3G a are diagrams illustrating respective processes in a method for fabricating a PRAM according to a preferred embodiment of the present invention.

Referring to FIG. 3A, the transistor 20 is formed on the substrate 10. Generally, the source 12 and the drain 14 are formed by doping the silicon wafer substrate 10 with the conductive impurities and the channel region 16 is formed between the source 12 and drain 14. Further, the gate insulation film 18 and the gate electrode 19 are sequentially stacked on the channel region 16, so that the transistor 20 can be finally formed. Since material and a method for forming the transistor 20 are already well known in the art, a detailed description thereof will be omitted.

Figure 3B:
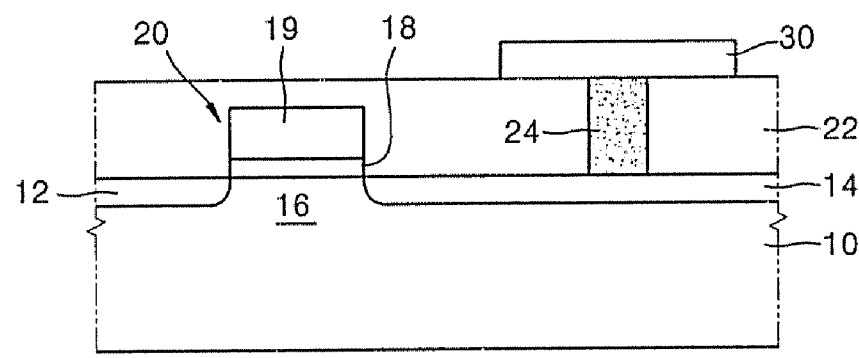

Referring to FIG. 3B, the insulation layer 22 is stacked on the transistor 20 and the contact hole is formed in the insulation layer 22 and the contact hole is filled with the conductive plug 24. After that, the bottom electrode 30 is so formed as to contact the conductive plug 24. Since the material and a method for forming the bottom electrode 30 in the PRAM are already well known in the art, a detailed description thereof will be omitted. For example, a resistive heater (not shown) having a small contact area can be further formed on the bottom electrode 30.

Figure 3C:
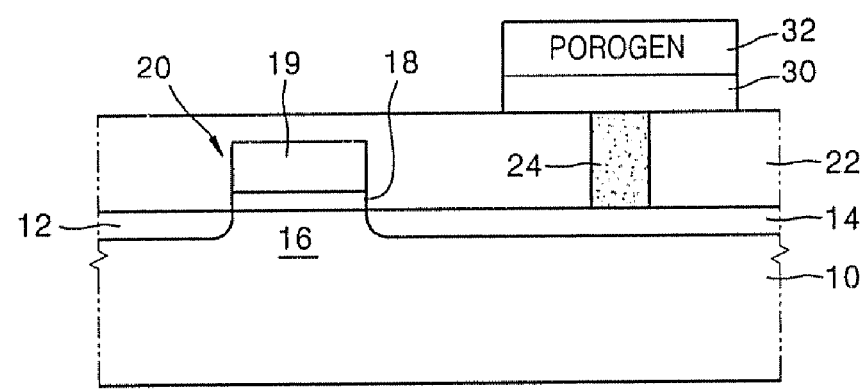

Referring to FIG. 3C, a porogen material layer 32 is formed on the bottom electrode 30. Generally, when selecting a method of forming the porogen material layer 32, a spin coating method is used but the method is not limited to this and other known thin film forming methods can be readily used. The porogen material is used for forming the porous PCM layer. Kinds and functions of the porogen material are well known in the art and the porogen material can be thermally decomposed and removed under a predetermined temperature range, e.g., approximately 300-500° C. For example, the porogen material can be selected from a compound group of cyclodextrin (CD). More specifically, a CD compound which has been generally applied as an intermediate for foods and medicines has been recently reported as the porogen for use in fabricating the porous insulation film. The CD compound is a compound of a circular structure where six to eight of glucopyranose groups are connected in a α-type and can be classified into α-, β- and γ-types. The β-type CD compound has a three-dimensional structure where the maximum radius is about 15.4 Å. The CD compound is uniformly dispersed in form of nano particles within a precursor of the siloxane series to create very small nano pores of less than 2 nm within a thin film during a high-temperature hardening process of the thin film. The β-type CD includes seven glucopyranoses and thus can have twenty-one hydroxyl groups in total. Compounds having a variety of functional groups can be produced. Using the above-described compound for the porogen, a pore's size, a size distribution, and an interconnection length can be controlled with the same pore degree being maintained. The thermally unstable porogen material for use in the present invention is a derivative of the CD as represented by following chemical Formula 1.

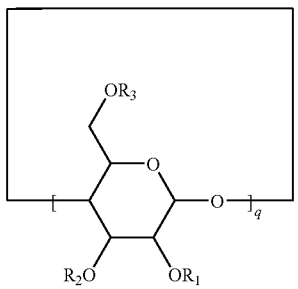

Formula 1

In above chemical Formula 1, q=3~12 and $R_1$, $R_2$, and $R_3$ are independently a hydrogen atom, an acyl group of $C_2$-$C_{30}$, an alkyl group of $C_1$ to $C_{20}$, an alkene group of $C_3$-$C_{10}$, an alkyne group of $C_3$-$C_{20}$, a tosyl group of $C_7$-$C_{20}$, a mesyl group of $C_1$-$C_{10}$, an amino group of $C_0$-$C_{10}$, an azido group, a halogen group, a phosphorus group, an imidazole group of $C_3$-$C_{20}$, a pyridino group, a functional group containing a sulfur of $C_0$-$C_{10}$, a cycloalkyl group of $C_3$-$C_{10}$, an aryl group of $C_6$-$C_{30}$, a hydroxy alkyl group, a carboxyl group, a carboxy alkyl group, a glucosyl group of $C_6$-$C_{12}$, a maltosyl group, a cyno group of $C_1$-$C_{10}$, a carbonate group of $C_2$-$C_{10}$, a carbamate group of $C_1$-$C_{10}$, or silicon compound represented by $Sir_1r_2r_3$, where $r_1$, $r_2$, and $r_3$ are independently an alkyl group of $C_1$-$C_5$, an alkoxy group of $C_1$-$C_5$, and an aryl group of $C_6$-$C_{20}$, respectively.

The porogen material used in the present invention is heptakis(2,3,6-tri-O-methyl)-beta-cyclodextrin and its decomposition temperature is in a range of 320-390° C.

Figure 3D:
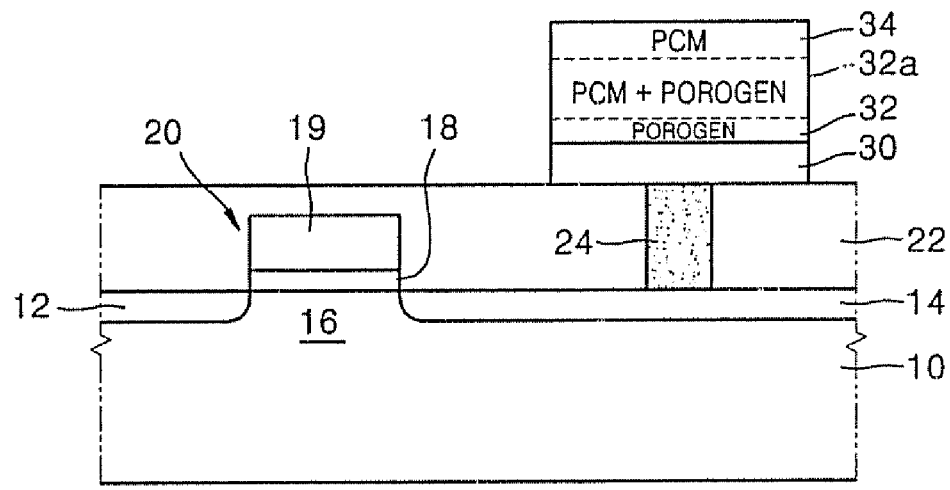

Referring to FIG. 3D, the PCM 34 layer is formed on the porogen material layer 32. The PCM layer can be formed by a sputtering method but the method is not limited to the sputtering and other known thin film forming methods can be used.

The PCM is a chalcogenide material, e.g., a material of GeSeTe (GST) series. Since the PCM used in the PRAM is already well known in the art, a detailed description thereof is omitted. For example, for the PCM used in the PRAM, there can be GeSbTe, AgSbTe, AgInTe, As(In)SbTe, GeTe, SeSbTe, AsSeTe, or Pb(Bi)Ge(In)Se.

A boundary region 32a is formed between the porogen material layer 32 and the PCM layer 34 during the process of forming the PCM layer 34. The boundary region 32a is a material layer where the PCM and the porogen material are mixed. It is estimated that the boundary region 32a is formed because the PCM mixes or penetrates into the porogen material layer 32 to a predetermined depth during the sputtering.

Figure 3E:
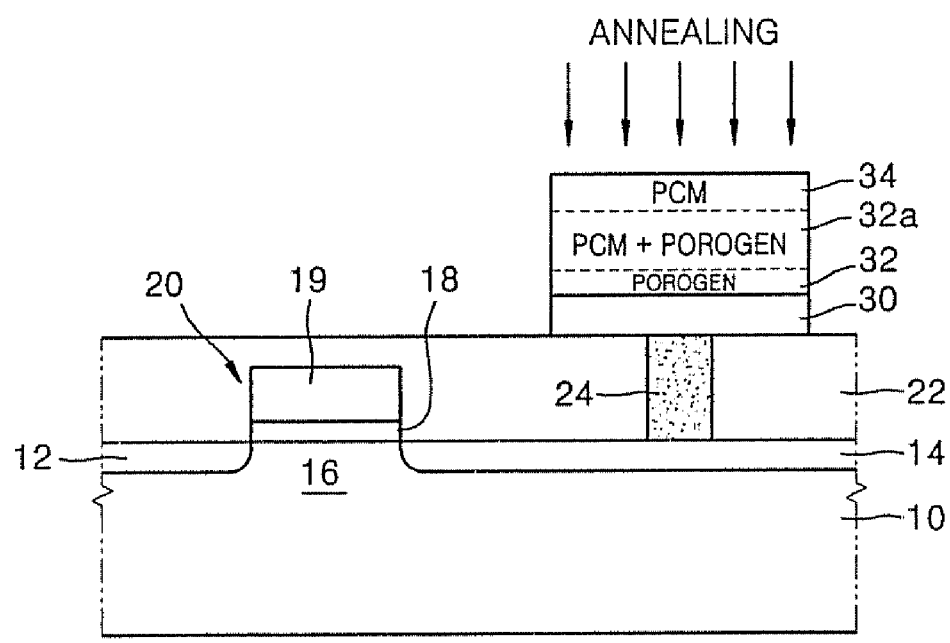
Figure 3F:
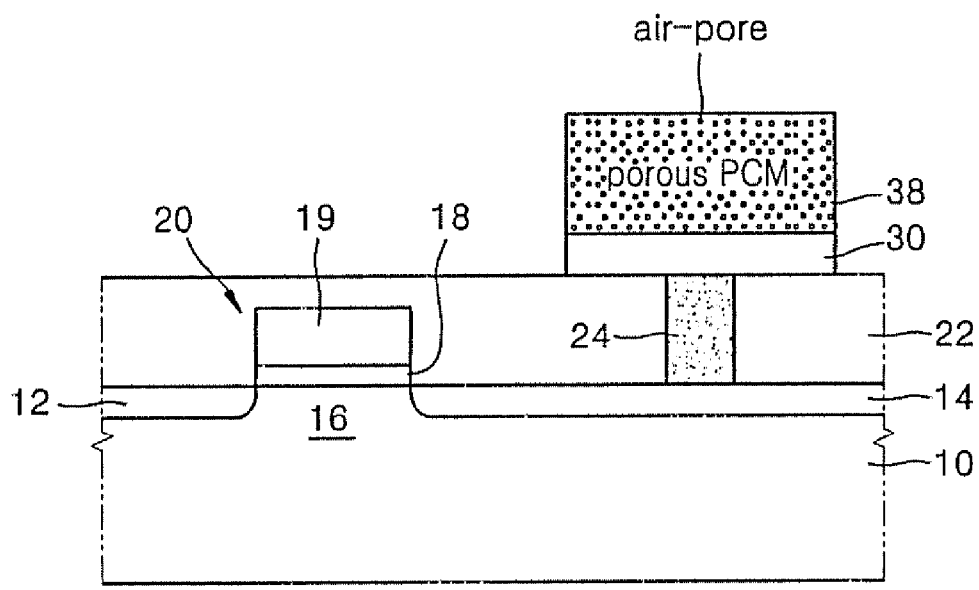

Referring to FIGS. 3E and 3F, the stacked products are annealed so that the porogen material is decomposed. The annealing can be performed for approximately 0.1-3 hours at a temperature in the range of approximately 300-500° C. During the annealing process, the porogen material can be thermally decomposed and thus removed and simultaneously the porous PCM layer 38 containing nano air-pores can be obtained. Here, a diameter of the air-pore is in a range of approximately 1-10 nm. An sheet resistance of the PCM layer 38 containing the nano air-pores is 0.495 kΩ/sq in average, about three times greater than 0.15 kΩ/sq, which is an sheet resistance of the conventional PCM layer 38 not containing the air-pores. The increase in the sheet resistance suggests that the air-pores of a nano scale have been formed within the porous PCM layer 38.

Figure 3G:
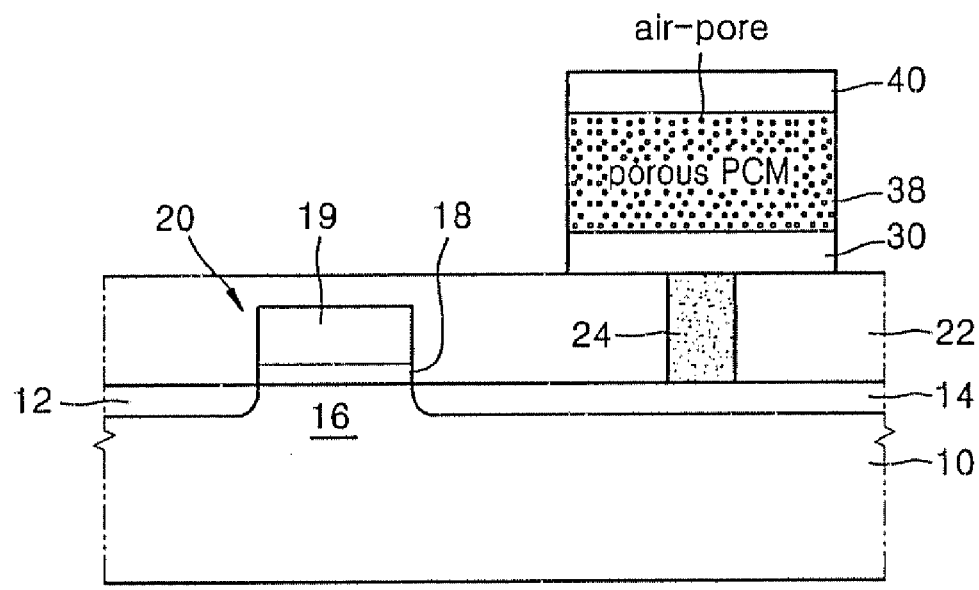

Referring to FIG. 3G, the top electrode is formed on the porous PCM layer 38 using the conductive material. Therefore, the current density is increased in the PCM layer during the above-described process, so that the PRAM having a structure capable of reducing the reset current can be obtained.

Figure 4:
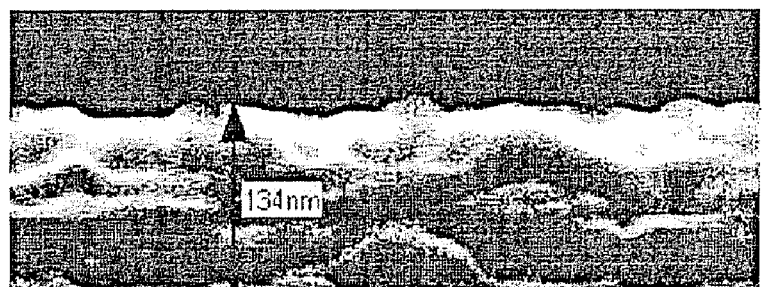
FIG. 4 is a scanning electron microscope (SEM) photo illustrating a cross-section of a PCM layer that corresponds to FIG. 3D.
Figure 4:
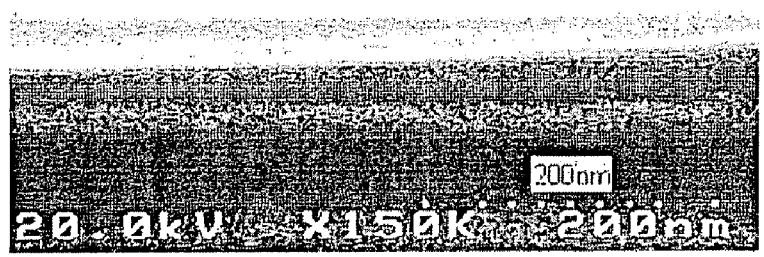
Figure 5:
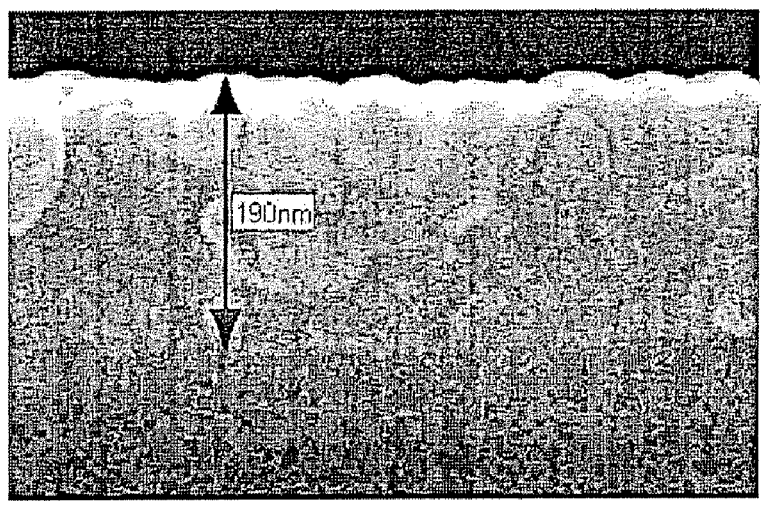
FIG. 5 is a SEM photo illustrating a cross-section of a PCM layer that corresponds to FIG. 3F.

FIGS. 4 and 5 are SEM photos illustrating cross-sections of the PCM layer that correspond to FIGS. 3D and 3F, respectively.

FIGS. 6A through 6I are diagrams illustrating respective process steps in a method for fabricating a PRAM according to another embodiment of the present invention. Here, a description will be omitted for the parts already descried in connection with the embodiments of FIGS. 3A through 3G and like reference numerals in the drawings denote like elements, and thus their description is omitted.

Here, process steps up to the forming the bottom electrode 30 are the same as in the former embodiment.

Figure 6A:
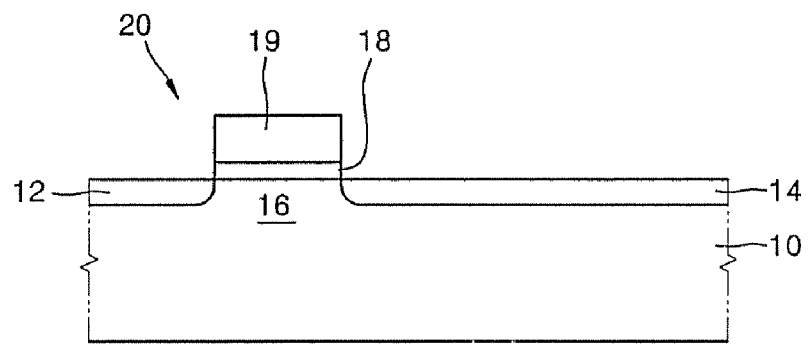
FIGS. 6A through 6I are diagrams illustrating respective processes in a method for fabricating a PRAM according to another embodiment of the present invention.
Figure 6B:
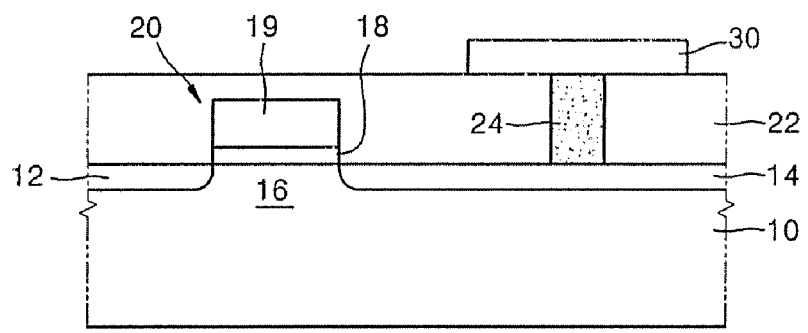
Figure 6C:
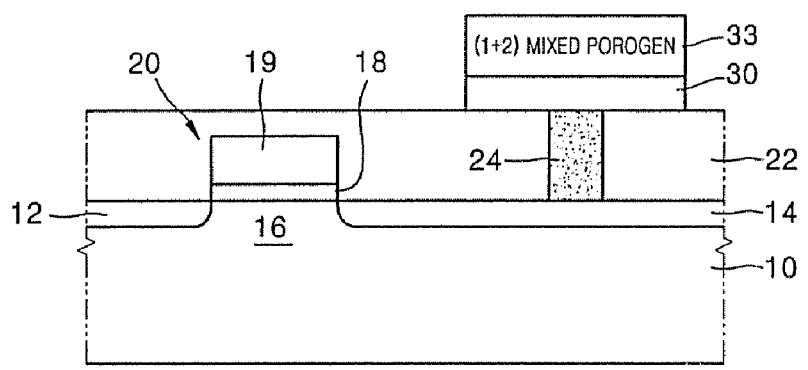

Referring to FIG. 6C, a mixed porogen material layer 33 where first porogen material and second porogen material are mixed is formed on the bottom electrode 30. For a method of forming the mixed porogen material layer 33, a spin coating method or other known thin film forming methods can be used. The mixed porogen material can be prepared by mixing the first porogen material and the second porogen material. Here, the second porogen material is a material having a relatively higher decomposition temperature than the first porogen material. For example, the first and the second porogen material can be selected from the above-described CD compound group with a consideration of the decomposition temperature. The first porogen material used in the present invention is heptakis(2,3,6-tri-O-hydroxyl)-beta-cyclodextrin and its decomposition temperature is in the range of approximately 300-350° C. The second porogen material is heptakis(2,3,6-tri-O-benzoyl)-beta-cyclodextrin and its decomposition temperature is in the range of approximately 370-439° C.

Figure 6D:
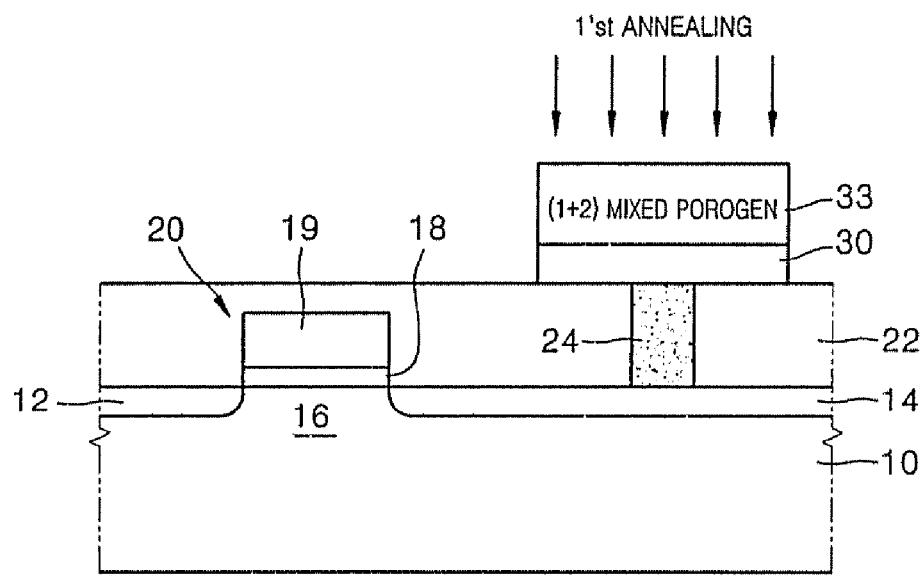
Figure 6E:
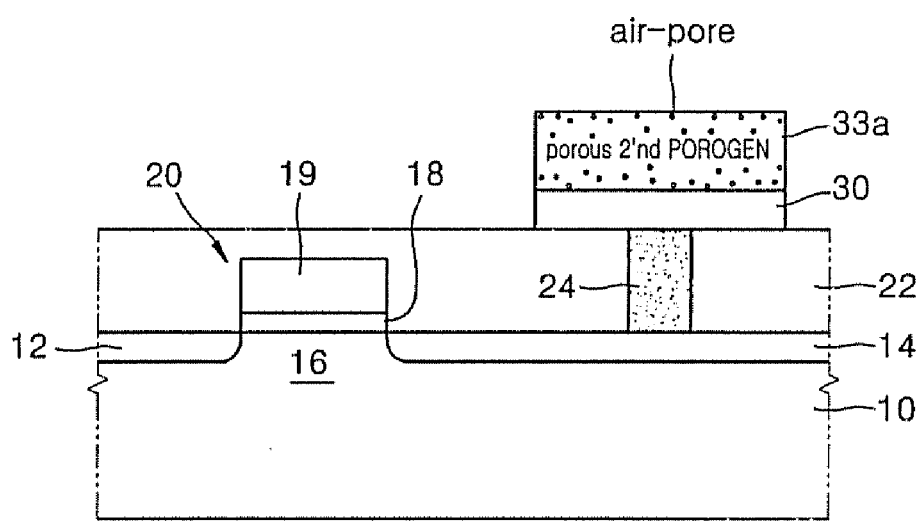

Referring to FIGS. 6D and 6E, the mixed porogen material layer 33 is first processed by annealing. The first annealing is performed for approximately 0.1-3 hours at a temperature in the range of approximately 300-500° C. The first porogen material included within the mixed porogen material layer 33 is decomposed and is removed during the first annealing process, so that the porous second porogen material layer 33a can be obtained. A far greater amount of the PCM can be mixed into the porous second porogen material layer 33a afterwards and far greater amount of the air-pores can be formed within the PCM layer afterwards. That is, the air-pores' density can be increased within the PCM layer containing the nano air-pores.

Figure 6F:
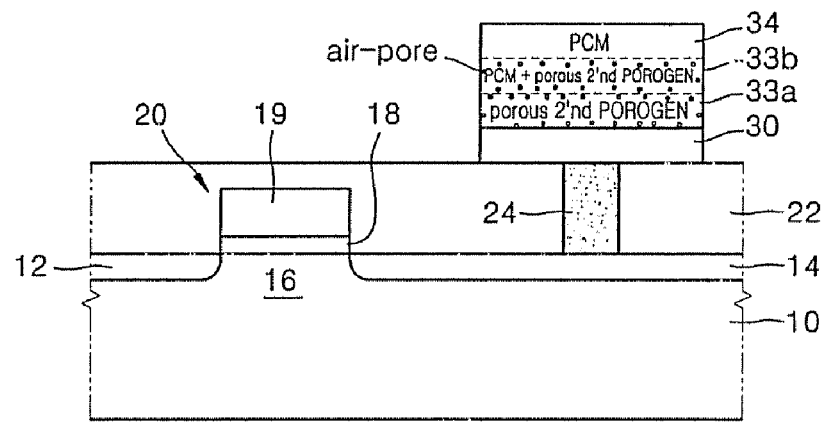

Referring to FIG. 6F, the PCM layer is formed on the porous second porogen material layer. The PCM layer can be formed by the sputtering method but the method is not limited to the sputtering and other known thin film forming methods can be used. The PCM is a chalcogenide material, e.g., a material of the GeSeTe (GST) series. Since the PCM used in the PRAM is already well known in the art, a detailed description thereof is omitted. For example, for the PCM used in the PRAM, there can be GeSbTe, AgSbTe, AgInTe, As(In)SbTe, GeTe, SeSbTe, AsSeTe, or Pb(Bi)Ge(In)Se.

A boundary region 33b is formed between the porous second porogen material layer 33a and the PCM layer 34 during the process of forming the PCM layer 34. The boundary region 33b is a material layer where the PCM and the porous second porogen material are mixed. It is estimated that the boundary region 33b is formed because the PCM mixes or penetrates into the porous second porogen material layer 33a to a predetermined depth during the sputtering. Particularly, a far greater amount of the PCM can be mixed into the porous second porogen material layer 33a and the air-pores' density can be increased within the PCM layer containing the air-pores afterwards.

Figure 6G:
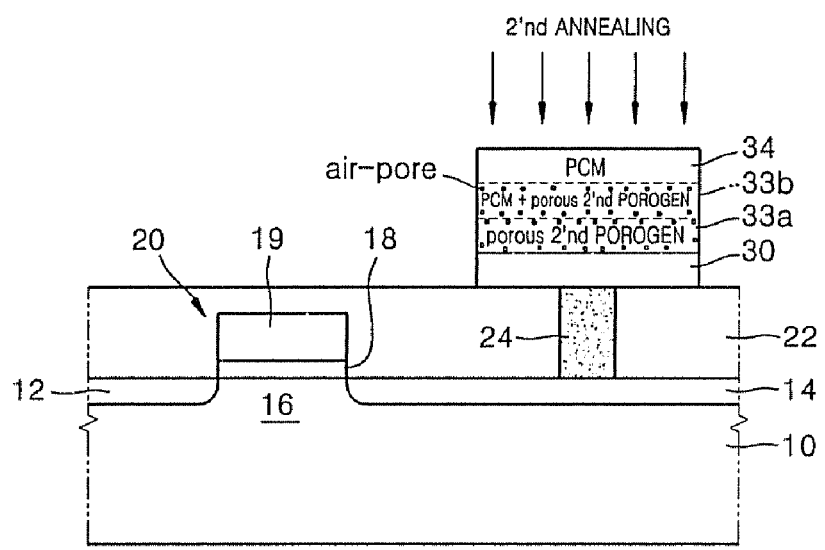
Figure 6H:
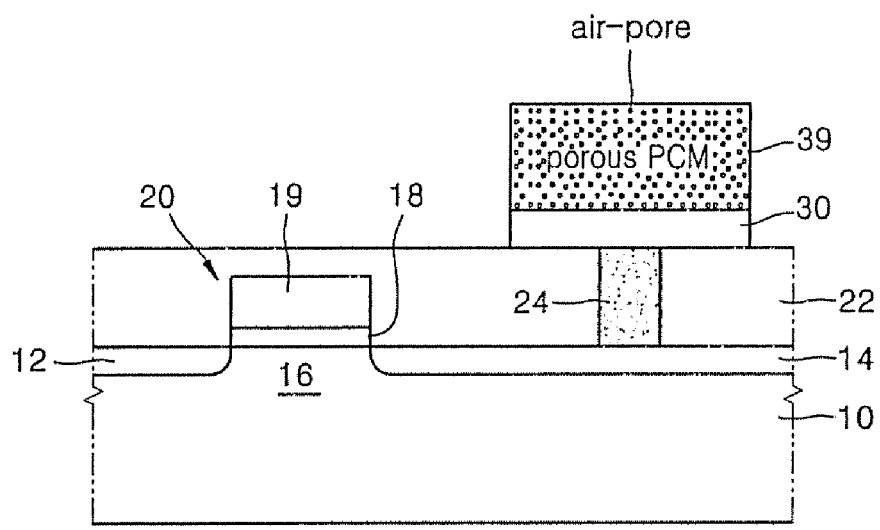

Referring to FIGS. 6G and 6H, the stacked products are annealed so that the second porogen material is decomposed. The annealing can be performed for approximately 0.1-3 hours at a temperature range of approximately 300-500° C. Here, the second annealing should be performed at a relatively higher temperature range than the first annealing. During the annealing process, the second porogen material can be thermally decomposed and thus removed and simultaneously the porous PCM layer 39 containing nano air-pores can be obtained.

Figure 6I:
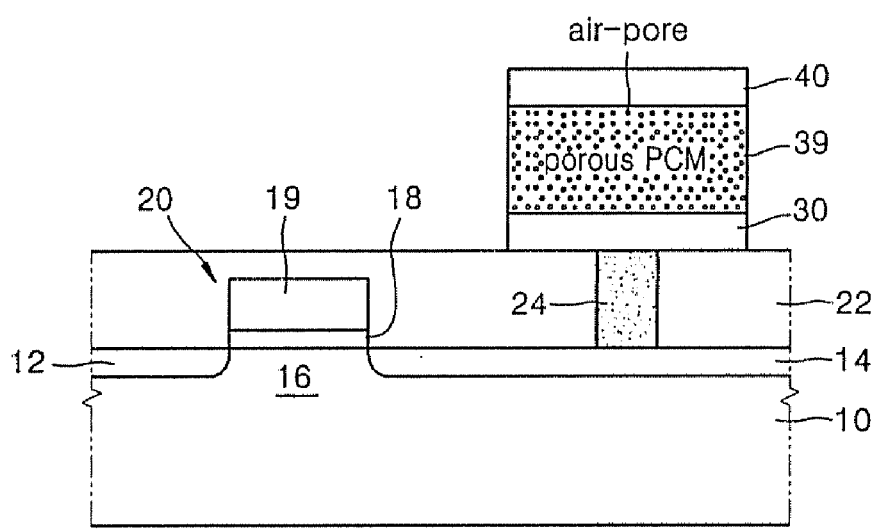

Referring to FIG. 6I, the top electrode is formed on the porous PCM layer 39 using the conductive material. Therefore, the current density is increased in the PCM layer through the above-described process, so that the PRAM having a structure capable of reducing the reset current can be obtained.

Figure 7:
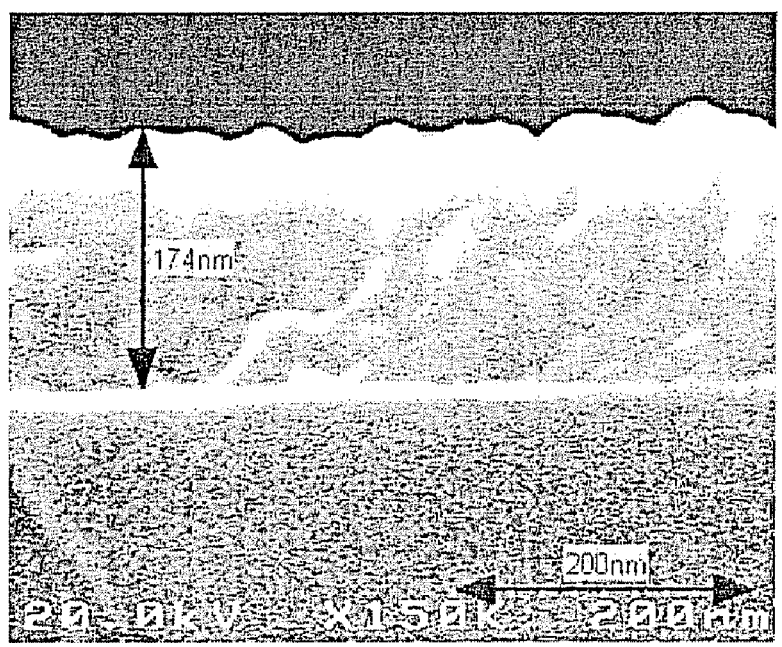
FIG. 7 is a SEM photo illustrating a cross-section of a PCM layer that corresponds to FIG. 6F.
Figure 8:
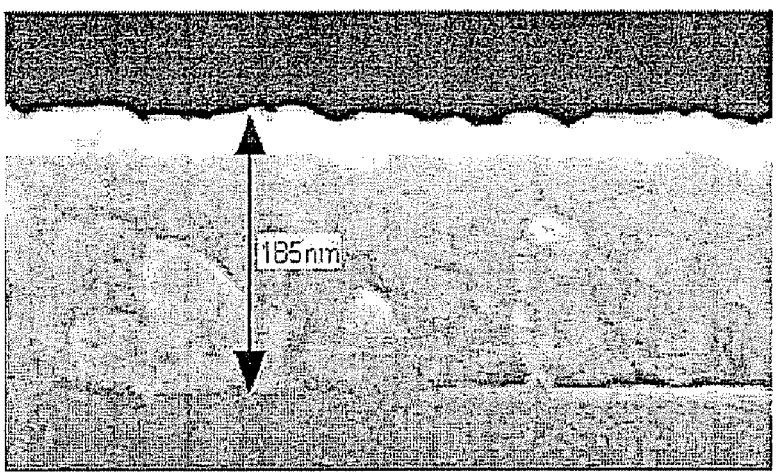
FIG. 8 is a SEM photo illustrating a cross-section of a PCM layer that corresponds to FIG. 6H.

FIGS. 7 and 8 are SEM photos illustrating cross-sections of the PCM layer that correspond to FIGS. 6F and 6H.

The PRAM of the present invention includes the porous PCM layer containing the nano air-pores. Since the nano air-pores increase the current density of the PCM layer, a phase-change of the porous PCM layer can occur at a smaller current condition. According to the present invention, the PRAM having the structure capable of reducing the reset current can be achieved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A PRAM (phase-change random access memory) comprising:
    a switching element; and
    a data storage connected to the switching element, the data storage including a first electrode, a second electrode, and a porous PCM (phase-change material) interposed between the first electrode and the second electrode.

2. The PRAM of claim 1, wherein the porous PCM comprises nano air-pores.

3. The PRAM of claim 2, wherein a diameter of each air-pore is in a range of approximately 1-10 nm.

4. The PRAM of claim 2, wherein the PCM is a chalcogenide material.

5. The PRAM of claim 4, wherein the chalcogenide material is material of the GeSeTe series.

6. The PRAM of claim 1, wherein the switching element is a transistor.

7. A PRAM (phase-change random access memory) including a data storage, wherein the data storage comprising a first electrode, a second electrode, and a porous PCM (phase-change material) interposed between the first electrode and the second electrode.

8. The PRAM of claim 7, wherein the porous PCM comprises nano air-pores.

9. The PRAM of claim 8, wherein a diameter of each air-pore is in a range of approximately 1-10 nm.

10. The PRAM of claim 8, wherein the PCM is a chalcogenide material.

11. The PRAM of claim 10, wherein the chalcogenide material is a material of the GeSeTe series.

12. A memory device having a data storage comprising:
    a first electrode;
    a second electrode; and
    a porous chalcogenide material interposed between the first electrode and the second electrode.

13. The memory device of claim 12, wherein the porous chalcogenide material comprises nano air-pores.

14. The memory device of claim 13, wherein a diameter of each air-pore is in a range of approximately 1-10 nm.

15. The memory device of claim 12, wherein the porous chalcogenide material is material of the GeSeTe series.

16. The memory device of claim 15, wherein the porous chalcogenide material comprises nano air-pores.

17. The memory device of claim 16, wherein the diameter of each air-pore is in the range of approximately 1-10 nm.

* * * * *